US006610961B1

(12) United States Patent
Cheng

(10) Patent No.: US 6,610,961 B1
(45) Date of Patent: Aug. 26, 2003

(54) SYSTEM AND METHOD OF WORKPIECE ALIGNMENT IN A LASER MILLING SYSTEM

(75) Inventor: Chen-Hsiung Cheng, Chelmsford, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/267,028

(22) Filed: Oct. 8, 2002

Related U.S. Application Data

(60) Provisional application No. 60/398,399, filed on Jul. 25, 2002.

(51) Int. Cl.$^{7}$ .................................... B23K 26/38
(52) U.S. Cl. .................................... 219/121.71
(58) Field of Search .................... 219/121.7, 121.71, 219/121.78, 121.81, 121.82, 121.83, 121.85

(56) References Cited

U.S. PATENT DOCUMENTS 5,418,345 A * 5/1995 Adamski
5,741,096 A * 4/1998 Olds

* cited by examiner

*Primary Examiner*—Samuel M. Heinrich
(74) *Attorney, Agent, or Firm*—Harness, Dickey & Pierce, PLC

(57) ABSTRACT

A method is provided for aligning a workpiece in a laser drilling system. The method includes: determining position data for two or more target alignment markers residing on a movable workpiece holder, where the target alignment markers are defined in relation a drilling pattern for the workpiece and indicate a target workpiece position; placing a workpiece on the movable workpiece holder; measuring position data for alignment markers associated with the workpiece, thereby determining an actual workpiece position; and computing a translation angle between the actual workpiece position and the target workpiece position simultaneously with computing a translation distance between the actual workpiece position and the target workpiece position. The method may further include adjusting the workpiece based on the computed translation angle and translation distance, thereby aligning the workpiece in the laser drilling system.

6 Claims, 8 Drawing Sheets

Method 500

Start
505 Determining pattern specifications
510 Placing workpiece on movable stage
515 Drilling initial pattern
520 Measuring position of selected holes
525 Calculating desired position of alignment marks
530 Repeating steps 520 and 525
535 Measuring position of alignment marks
540 Calculating translation angle and position of alignment marks
545 Are there alignment errors?
Yes / No
550 Moving sample stage to achieve desired alignment
End $A=(x_1, y_1)$
$B=(x_3, y_3)$
$C=(x_2, y_2)$
$D=(x_4, y_4)$ Before translation

SYSTEM AND METHOD OF WORKPIECE ALIGNMENT IN A LASER MILLING SYSTEM

CROSS-REFERENCE TO RELATED APPLICATIONS

This application claims the benefit of U.S. Provisional Application Serial No. 60/398,399 which was filed on Jul. 25, 2002 and is incorporated by reference herein.

FIELD OF THE INVENTION

The present invention relates to laser drilling systems, and more particularly, to a method for aligning a workpiece in a laser drilling system

BACKGROUND OF THE INVENTION

Material ablation by pulsed light sources has been studied since the invention of the laser. Reports in 1982 of polymers having been etched by ultraviolet (UV) excimer laser radiation stimulated widespread investigations of the process for micromachining. Since then, scientific and industrial research in this field has proliferated—mostly spurred by the remarkably small features that can be drilled, milled, and replicated through the use of lasers.

Ultrafast lasers generate intense laser pulses with durations from roughly $10^{-11}$ seconds (10 picoseconds) to $10^{-14}$ seconds (10 femtoseconds). Short pulse lasers generate intense laser pulses with durations from roughly $10^{-10}$ seconds (100 picoseconds) to $10^{-11}$ seconds (10 picoseconds). A wide variety of potential applications for ultrafast and short pulse lasers in medicine, chemistry, and communications are being developed and implemented. These lasers are also a useful tool for milling or drilling holes in a wide range of materials. Hole sizes as small as a few microns, even sub-microns, can readily be drilled. High aspect ratio holes can be drilled in hard materials, such as cooling channels in turbine blades, nozzles in ink-jet printers, or via holes in printed circuit boards.

Optical parallel processing of laser-milled holes is key to increasing the throughput of, and the profitability of laser micromachining. Beamsplitting devices such as diffractive optical elements (DOEs) are currently used in laser micromachining to divide a single beam into multiple beams to allow for parallel processing of the workpiece (material to be drilled). Hole geometry requirements, and the ability to produce consistent, repeatable results are critical to individual manufacturing applications. In inkjet nozzle hole drilling using laser micromachining, the consistency and repeatability of the nozzle holes translate to consistent print quality and acceptable print resolution.

Alignment of the workpiece is an important step to ensure that an entire multiple-hole pattern can be drilled at precisely the location required by design specifications. While alignment is less of an issue for a single hole to be drilled, it is much more important, and more difficult to accomplish with a multiple-hole pattern. What is needed is a way to improve accuracy of workpiece alignment in a parallel process laser drilling system.

SUMMARY OF THE INVENTION

In accordance with the present invention, a method is provided for aligning a workpiece in a laser drilling system. The method includes: determining position data for two or more target alignment markers residing on a movable workpiece holder, where the target alignment markers are defined in relation a drilling pattern for the workpiece and indicate a target workpiece position; placing a workpiece on the movable workpiece holder; measuring position data for alignment markers associated with the workpiece, thereby determining an actual workpiece position; and computing a translation angle between the actual workpiece position and the target workpiece position simultaneously with computing a translation distance between the actual workpiece position and the target workpiece position. The method may further include adjusting the workpiece based on the computed translation angle and translation distance, thereby aligning the workpiece in the laser drilling system.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DETAILED DESCRIPTION OF THE PREFERRED EMBODIMENTS

Figure 1:
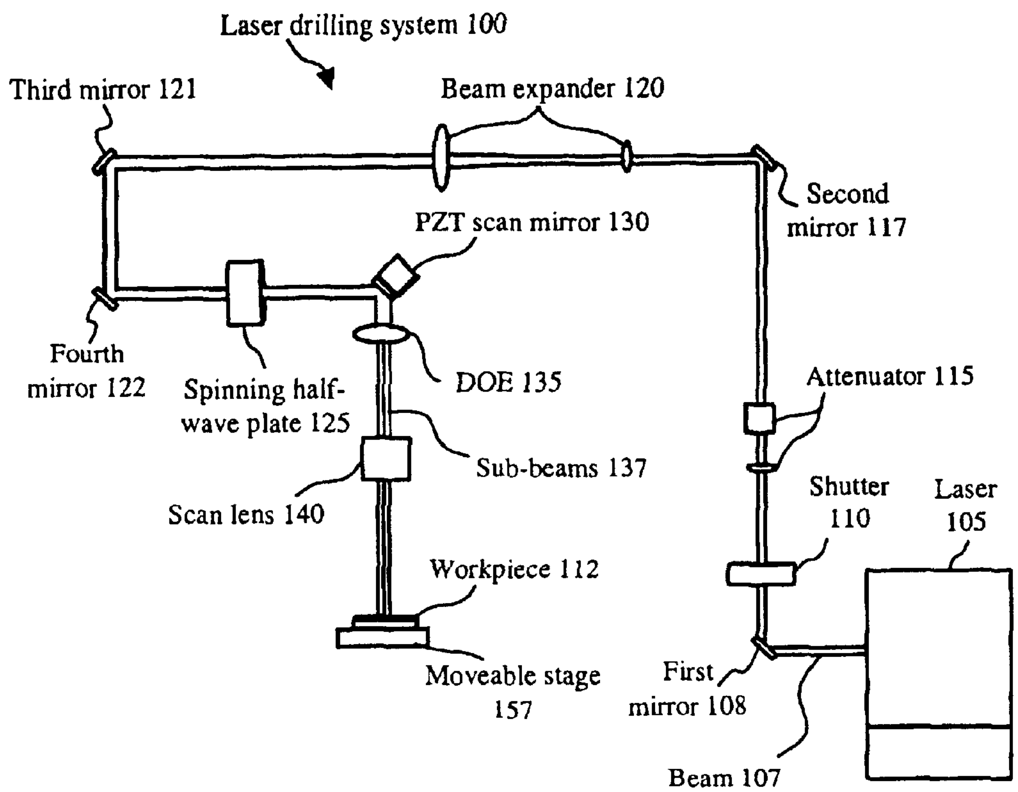
FIG. 1 is a diagram depicting the primary components of an exemplary laser drilling system in accordance with the present invention.

FIG. 1 shows a simplified schematic of a laser drilling system 100, including a laser 105, a shutter 110, an attenuator 115, a beam expander 120, a spinning half-wave plate 125, a first mirror 108, a second mirror 117, a third mirror 121, a fourth mirror 122, a piezo electric transducer (PZT) scan mirror 130, a diffractive optical element (DOE) 135, a scan lens 140, and a moveable stage 157, arranged as shown. Although the present invention uses a picosecond laser system, the present invention may be generalized for use with other laser systems, such as excimer, CO2, and copper vapor laser systems.

Although all elements of laser drilling system 100 are conventional, a brief description of the operation of laser drilling system 100 is provided below for clarity purposes. In alternate embodiments, changes in the elements of laser drilling system 100 may be required. The present invention is not limited to the current selection and arrangement of elements in laser drilling system 100.

In operation, picosecond laser 105 emits beam 107 along the optical path identified in FIG. 1 above. Beam 107 propagates along the optical path, where it is incident upon first mirror 108. First mirror 108 redirects beam 107 along the optical path, where it is incident upon shutter 110. Shutter 110 opens and closes to selectively illuminate the workpiece material. Beam 107 exits shutter 110 and propagates along the optical path to attenuator 115. Attenuator 115 filters the energy of picosecond laser 105 in order to precisely control ablation parameters. Beam 107 exits attenuator 115 and propagates along the optical path, where it is incident upon second mirror 117. Second mirror 117 redirects beam 107 along the optical path, where it is incident upon beam expander 120.

Beam expander 120 increases the size of beam 107 to match the pupil size of scan lens 140. Beam 107 exits beam expander 120 and propagates along the optical path, where it is incident upon third mirror 121. Third mirror 121 redirects beam 107 along the optical path, where it is incident upon fourth mirror 122. Fourth mirror 122 redirects beam 107 along the optical path, where it is incident upon spinning half-wave plate 125. Spinning half-wave plate 125 changes the polarization of beam 107. Upon exiting spinning half-wave plate 125, beam 107 propagates along the optical path, where it is incident upon PZT scan mirror 130. PZT scan mirror 130 moves in a pre-defined pattern using a drilling algorithm (not shown) to drill the holes in workpiece 112. PZT scan mirror 130 redirects beam 107 along the optical path, where it is incident upon DOE 135. DOE 135 splits beam 107 into a plurality of sub-beams 137, which allow parallel drilling of workpiece 112. Sub-beams 137 exit DOE 135 and propagate along the optical path, where they are incident upon scan lens 140. Scan lens 140 determines the spot size of sub-beams 137 upon workpiece 112. Sub-beam 137 exit scan lens 140 and propagate along the optical path, where they are incident upon workpiece 112. Sub-beams 107 ablate workpiece 112 in a pattern according to the pre-defined drilling algorithm. The moveable stage 157 is operable to orient the contact surface of the workpiece 112 in alignment with the focal plane of sub-beams 137.

Figure 2:
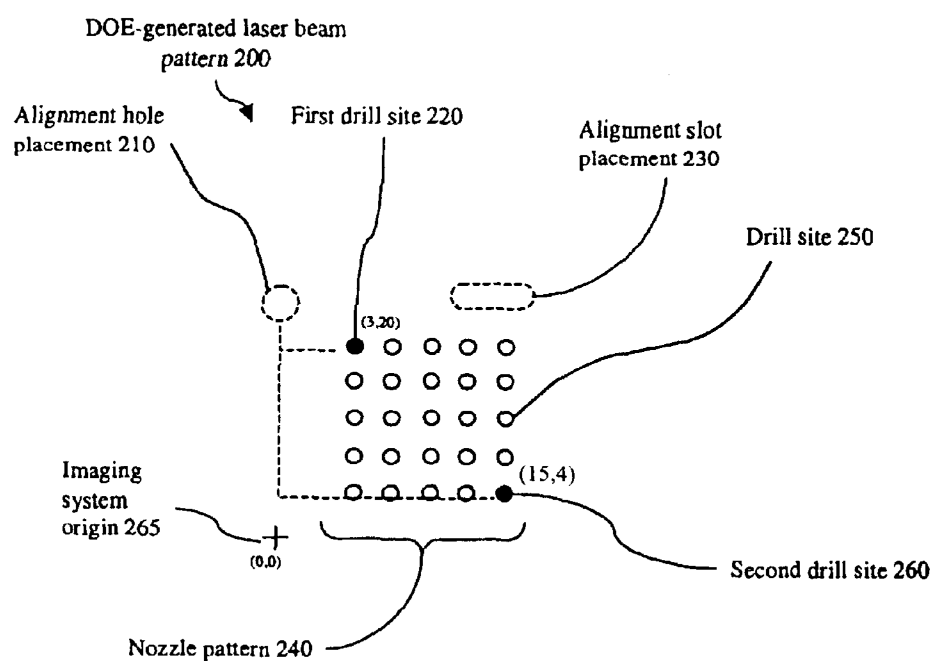
FIG. 2 is a top view diagram of an exemplary laser drilling pattern.

FIG. 2 shows a top view of a DOE-generated laser beam pattern to be drilled in workpiece 112, and includes an alignment hole 210, a first drill site 220, an alignment slot 230, a nozzle pattern 240 further having a plurality of drilled sites 250, a second drill site 260, and an imaging system origin 265.

Alignment hole placement 210 and alignment slot placement 230 are shown in FIG. 2 for clarity purposes and are not physically generated by DOE 135. Alignment hole placement 210 and alignment slot placement 230 represent a predetermined location with respect to nozzle pattern 240 designed to secure workpiece 112 onto movable stage 157 during laser drilling operations.

The location of alignment hole 210 and alignment slot placement 230 also act as a fixed measurement point for calculating the distance to first drill site 220 and second drill site 260 allowing the present invention to be applied, and allowing reorientation of workpiece 112 to bring it into proper alignment with nozzle pattern 240.

In the present invention, an imaging system (not shown) calculates the present x and y coordinates of first drill site 220 and second drill site 260 from imaging system origin 265. In addition, the imaging system is used to determine displacement of first drill site 220 and second drill site 260 with reference to predetermined alignment hole placement 210 and alignment slot placement 230. In the present example, the x,y coordinates of first drill site 220 are (3,20), while the x,y coordinates of second drill site 260 are (15,4).

Nozzle pattern 240 includes a plurality of drill sites 250 arranged in a pattern as shown in FIG. 2. Nozzle pattern 240 is sized according to customer specifications, but in other examples may be an 8 by 38 array, a 10 by 40 array, or any other configuration for a specific application.

Figure 3:
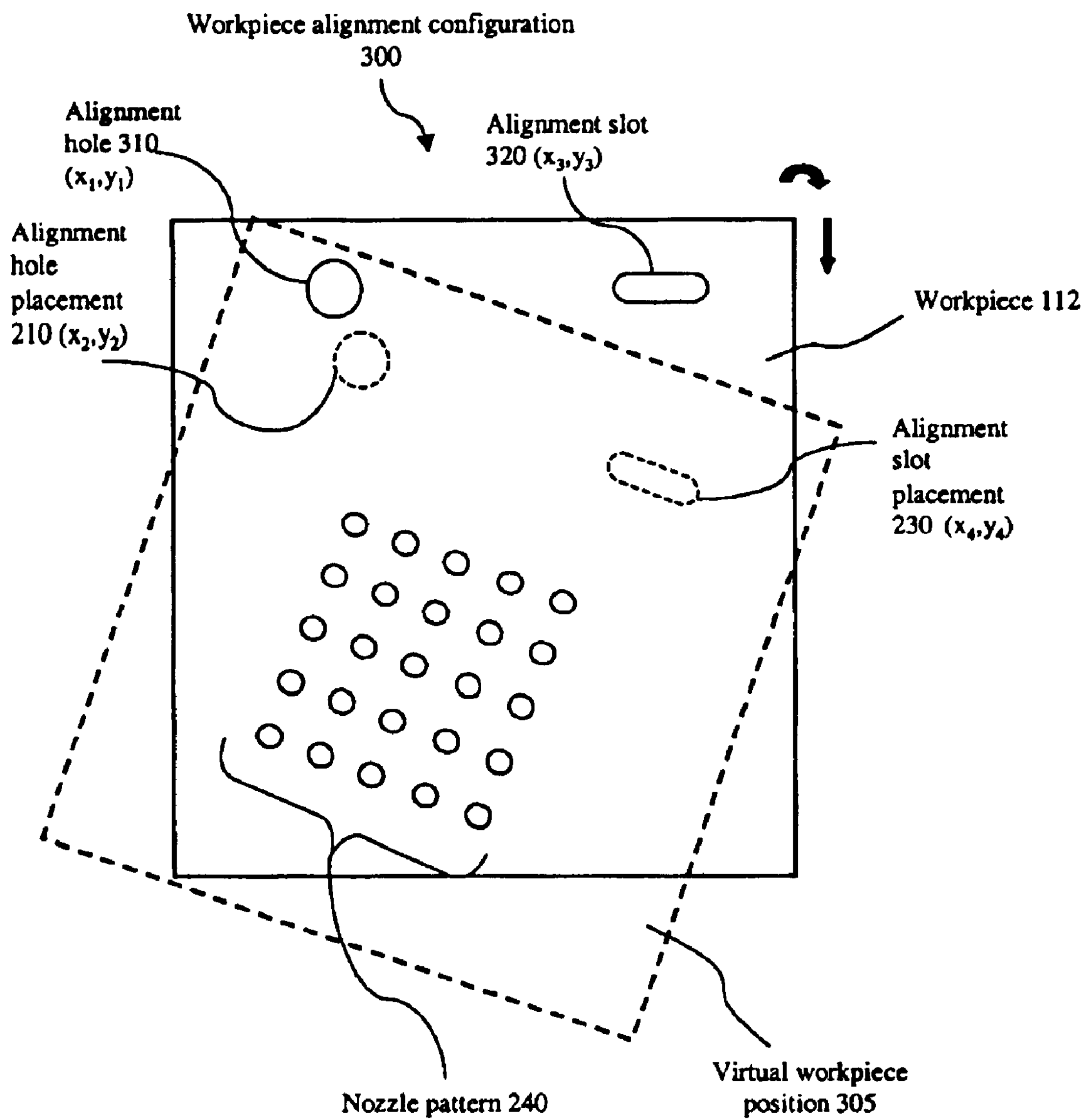
FIG. 3 is a top view diagram of a workpiece alignment configuration in accordance with the present invention.

FIG. 3 shows a top view of a workpiece alignment configuration 300 illustrating an original position of workpiece 112 and a virtual workpiece position 305, and further includes an alignment hole 310 and an alignment slot 320.

In operation, workpiece 112 is secured to movable stage 157 (also referred to herein as workpiece holder) using pre-drilled alignment hole 310 and alignment slot 320. DOE 135 splits beam 107 into a plurality of sub-beams 137, which form nozzle pattern 240 and are focused onto the surface of workpiece 112 to mill the prescribed nozzle pattern 240. Imaging system (not shown) displays projected nozzle pattern 240 in relation to the actual location of workpiece 112. Imaging system computations provide precise x,y coordinate locations for alignment hole placement 210 $(x_2, y_2)$, and alignment hole slot 260 $(x_4, y_4)$. A matrix calculation determines the rotation angle θ and the x,y offset $(x_0, y_0)$ required to properly align workpiece 112 with the projected nozzle pattern 240. Rotation and offset inputs are provided to a control unit (not shown), which directs movable stage 157 (FIG. 1) to the desired location. In another example, a laser system operator manually adjusts movable stage 157.

In the present example, movable stage 157 rotates workpiece 112 in a clockwise direction by angle θ and in an x, y direction by an offset of $(x_0, y_0)$. The rotation angle θ and offset $(x_0, y_0)$. are illustrated in FIG. 4 below, and are calculated from formulas discussed in the method that follows.

Figure 4A:
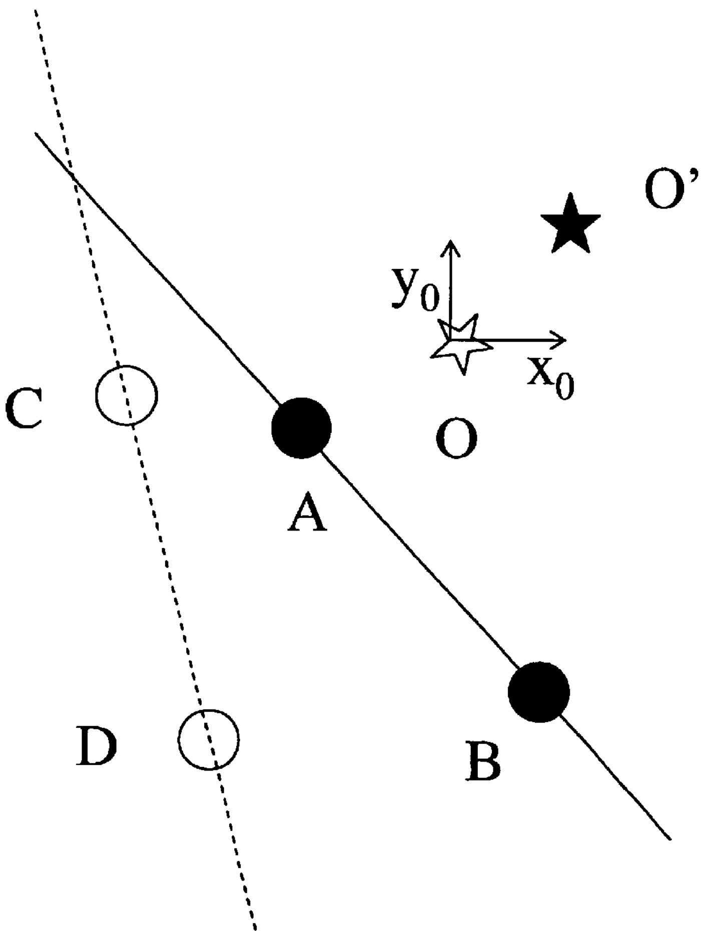
FIGS. 4A–4C are diagrams illustrating translation of a workpiece from an actual position to a desired position in accordance with the present invention.
Figure 4B:
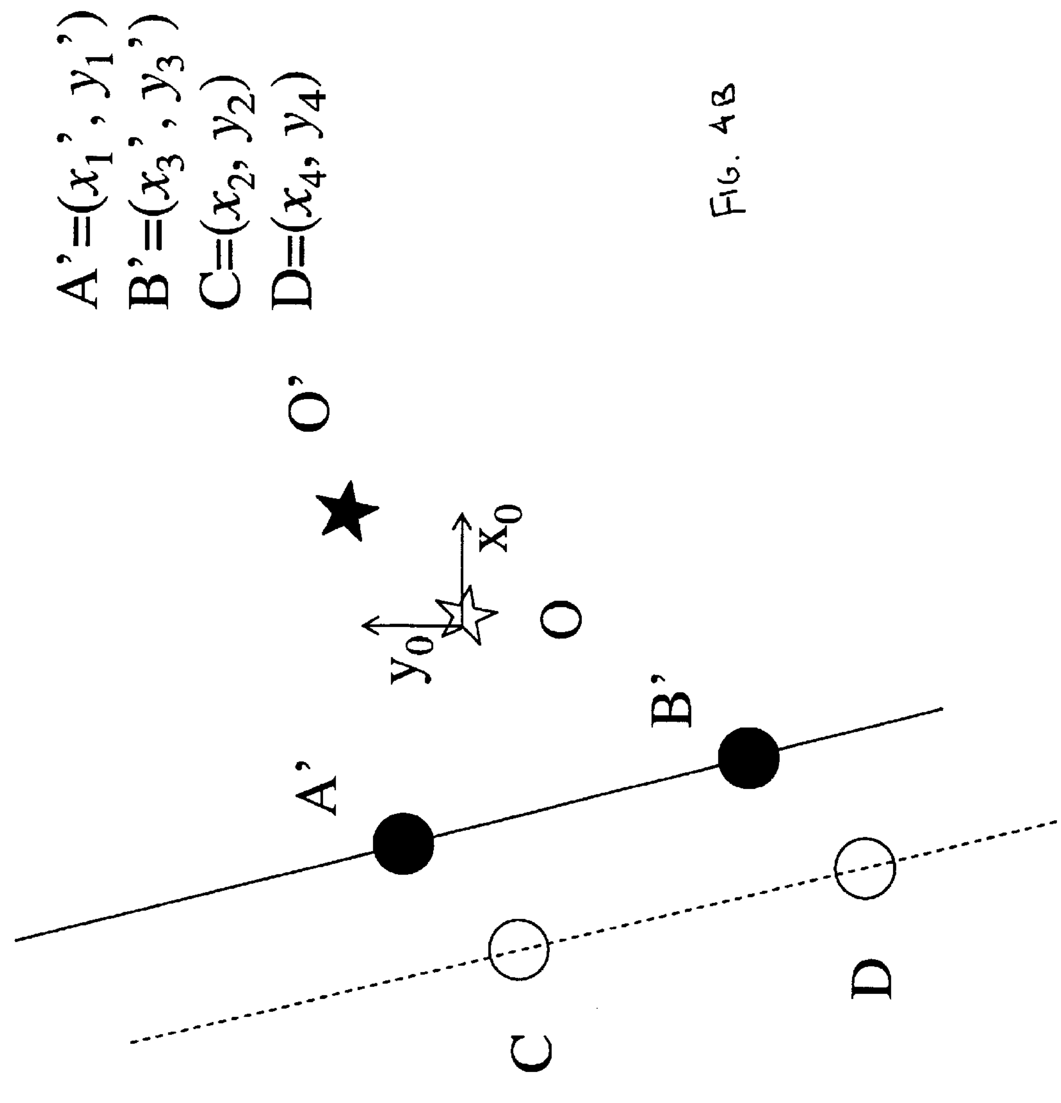
Figure 4C:
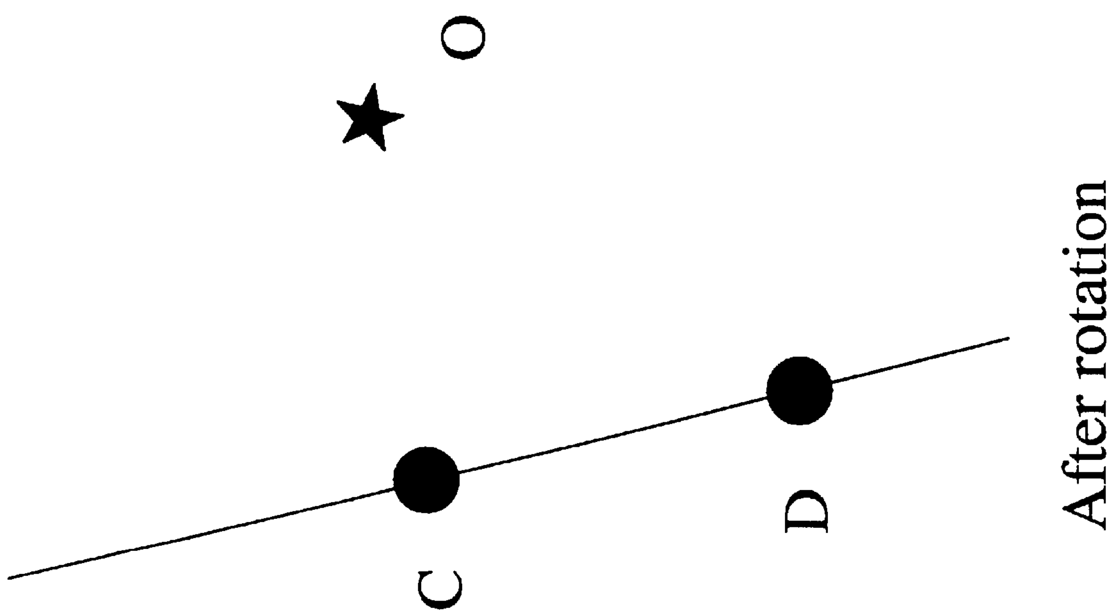

FIGS. 4*a*, 4*b* and 4*c* illustrate an example of the calculations needed to translate points from an actual position to a desired position (e.g. from alignment hole placement 210 $(x_2, y_2)$ to alignment hole 310 $(x_1, y_1)$).

The position of a pattern in a plane can be defined by a minimum of two fixed points in the pattern, which define a line in that plane, and its position can be described with respect to a two-dimensional grid. Thus, when a second pattern is to be drilled (identical to the first pattern) and needs to be aligned to the first pattern, one needs only to align the two fixed points of the second pattern with the fixed points of the first pattern to achieve the alignment of both patterns.

Given actual points A and B, which define a unique line, and desired positions C and D, which define a separate unique line, both an x, y translation and a rotational angle θ are needed to reposition the line represented by points A and B so that line A–B coincides with line C–D. Note that A,B are also required to be on top of C,D. In this example:

$$A=(x_1, y_1)$$

$$B=(x_3, y_3)$$

$$C=(x_2, y_2)$$

$$D=(x_4, Y_4)$$

FIG. 4*a* illustrates lines A–B and C–D before translation, including a center of rotation at point O. The location of point O is generally not known before the translation is made, but is shown to illustrate the translation step. From FIG. 4A to FIG. 4B, line A–B is rotated by angle θ to a position in parallel with line C–D. FIG. 4B illustrates lines A'–B' and C–D after rotation but before translation. In FIG. 4C, after both translation and rotation, line A'–B' is translated by an offset to match the line formed by points C and D.

In this example, the imaging system provides the two-dimensional grid, and the desired alignment hole placement 210 $(x_2, y_2)$ and alignment hole slot 230 $(x_4, y_4)$ provide the two points that also define a line to describe the desired position of nozzle pattern 240. Thus, by aligning the points of, preformed, alignment hole 310 ($x_1$, $y_1$) and alignment slot 320 ($x_3$, $y_3$) with the points of desired alignment hole placement 210 ($x_2$, $y_2$) and alignment slot placement 230 ($x_4$, $y_4$), nozzle pattern 240 is properly aligned to the designed placement.

Figure 5:
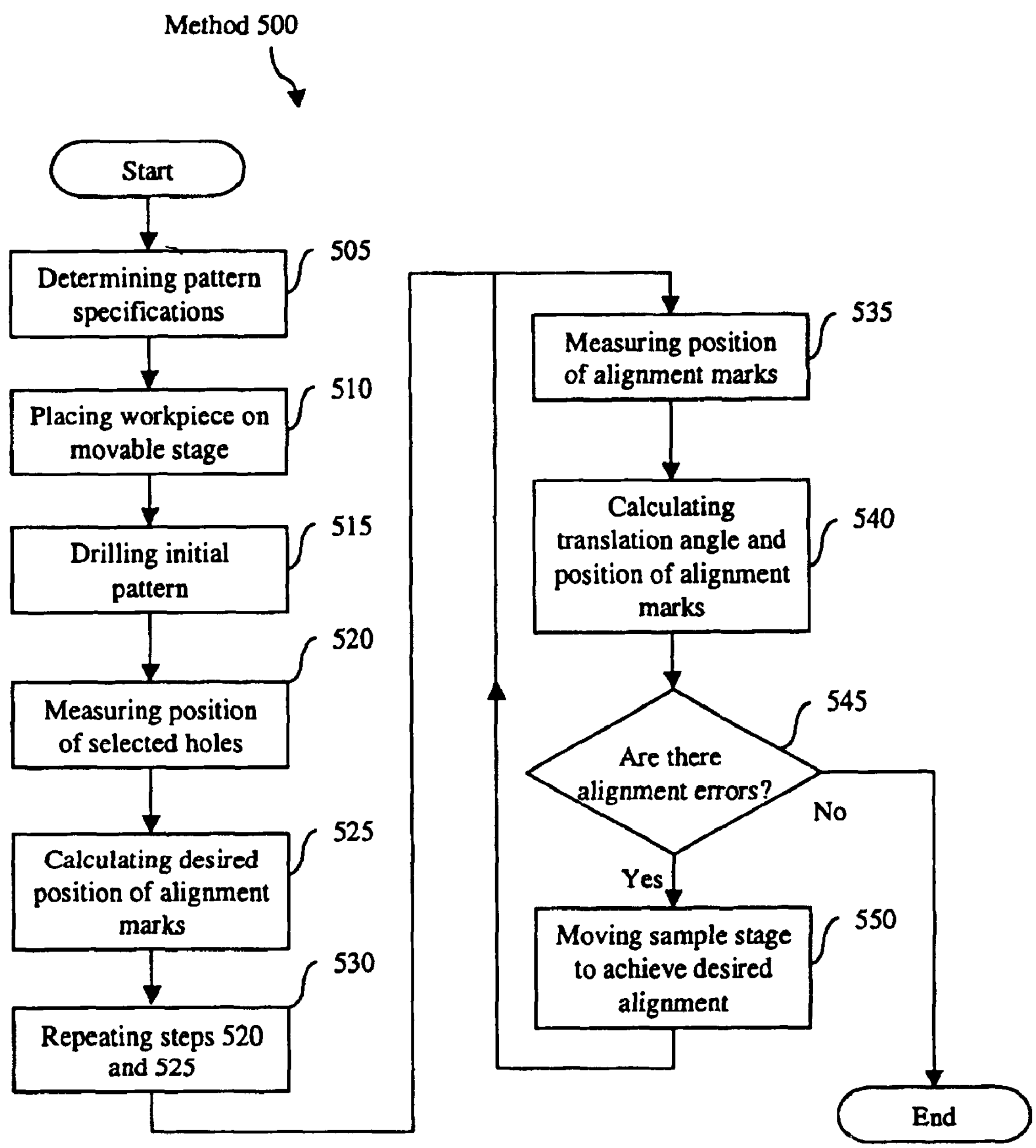
FIG. 5 is a flowchart depicting an exemplary method for aligning a workpiece in a laser drilling system in accordance with the present invention.

FIG. 5 illustrates a method of calculating and executing workpiece alignment in a laser drilling system. Of particular interest, the method illustrates how the above-described two components of an x,y offset ($x_0$, $y_0$) and rotational translation θ are calculated.

First, the specifications of the drilling pattern and other parameters associated with the laser drilling system are determined in step 505. In this step, a laser system operator or technician determines the nozzle pattern to match design and/or customer specifications including pattern shape, hole size and hole geometry. The position of nozzle pattern 240 is determined with respect to alignment hole placement 210 and alignment slot placement 260 such that the x,y distance from alignment hole placement 210 to fixed points on nozzle pattern 240 is known.

The workpiece 112 is then placed on the movable stage 157 of the laser drilling system at step 510. In this step, workpiece 112 is secured onto movable stage 157 via alignment pins that are preformed at initial placements of alignment hole 310 and alignment slot 320. In one example, a vacuum may be used to secure workpiece 112 to movable stage 157. The technician makes the appropriate pre-drilling changes to the elements of laser drilling system 100.

Next, the desired drilling patter is projected onto the surface of the workpiece. In this step, laser drilling system 100 generates beam 107, which propagates through laser drilling system 100 as shown in FIG. 1. DOE 135 splits beam 107 into a plurality of sub-beams 137, which form nozzle pattern 240 and which are focused onto the surface of workpiece 112. Laser system 100 performs drilling of nozzle pattern 240 into workpiece 112.

In step 520, position data for the alignment markers associated with the workpiece is measured, thereby determining an actual workpiece position. An imaging system (such as an IMAQ Vision Builder software in conjunction with a PCI 1428 image acquisition board, not shown) is used to measure the position of first drill site 220 and second drill site 260 in relation to a fixed origin of the imaging system. In the present example, first drill site 220 and second drill site 260 are used as reference points for measurement. In principle any two holes can be used, however, the accuracy of the calculated displacement is dependant on the distance between the selected holes and is generally more accurate when this distance is greater.

In step 525, the desired (or target) position for the alignment markers is calculated. The desired x,y coordinates of alignment hole placement 210 and alignment slot placement 230 are calculated, using the imaging system, with respect to first drill site 220 and second drill site 260 by using the design/customer specifications that were determined in step 505. As shown in step 530, steps 520 and 525 may be repeated a predetermined number of times. The results are then averaged to provide enough data to average out measurement error and calculate a more accurate solution.

In step 535, the x,y coordinates of alignment hole placement 310 and alignment slot placement 320 are measured, using the imaging system, with respect to first drill site 220 and second drill site 260.

Calculation of the translation angle between the actual workpiece position and the target workpiece position and the translation distance between the actual workpiece position and the target workpiece position is simultaneously computed in step 540. Specifically, matrix calculations are used to determine the translation angle θ and x,y-displacement, ($x_0$, $y_0$), from current alignment hole placement 310 and alignment slot placement 320 to desired placements 210 and 230.

To calculate how to relocate the point with coordinates of ($x_1$, $y_1$) to new coordinates of ($x_2$, $y_2$), a rigid body transforbmation is used, where the transformation has rotation angle θ and displacement of ($x_0$, $y_0$). The equation for this transformation is represented as:

$$\begin{bmatrix} x_2 \\ y_2 \end{bmatrix} = \begin{bmatrix} \cos\theta & -\sin\theta \\ \sin\theta & \cos\theta \end{bmatrix} \begin{bmatrix} x_1 \\ y_1 \end{bmatrix} + \begin{bmatrix} x_0 \\ y_0 \end{bmatrix}$$

The objective is to determine θ, and ($x_0$, $y_0$). Because the above equation only provides two constraints, there is no unique solution to the equation. However, additionally using a second set of equation for a second measurement point, the system is over-constrained and may provide no solution at all due to the small but inevitable measurement errors. In order to be sufficient enough to uniquely determine θ, and ($x_0$, $y_0$), using two alignment points is absolutely necessary. The over-constraining condition is lifted by the following strategy. In order to also take advantage of the extra information provided and reduce the error/uncertainty in the measurement, cos θ and sin θ are considered to be independent during calculations, then the two results are averaged to reach a final determination of θ. Statistically, the measurement error of θ is reduced by a factor of the square root of 2 for each transformation calculation.

For two measurement points, the rigid body transform is represented as follows:

$$\begin{bmatrix} x_2 \\ y_2 \\ x_4 \\ y_4 \end{bmatrix} = \begin{bmatrix} \cos\theta & -\sin\theta & 0 & 0 \\ \sin\theta & \cos\theta & 0 & 0 \\ 0 & 0 & \cos\theta & -\sin\theta \\ 0 & 0 & \sin\theta & \cos\theta \end{bmatrix} \begin{bmatrix} x_1 \\ y_1 \\ x_3 \\ y_3 \end{bmatrix} + \begin{bmatrix} x_0 \\ y_0 \\ x_0 \\ y_0 \end{bmatrix}$$

where θ is the translation angle, ($x_0$, $y_0$) is the translation distance, ($x_1$, $y_1$) is positional data for the first alignment marker, ($x_2$, $y_2$) is the target position of the first alignment marker, ($x_3$, $y_3$) is positional data for the second alignment marker, and ($x_4$, $y_4$) is the target position of the second alignment marker.

The equation above can be rewritten using the following substitution:

$$a=\cos\theta$$

$$b=\sin\theta$$

$$c=x_0$$

$$d=y_0$$

where, using alignment hole placement 220 ($x_2$, $y_2$):

$$x_2=ax_1-by_1+c$$

$$y_2=bx_1-ay_1+d$$

The same equation can be applied to a alignment slot placement 260 ($x_4$, $y_4$), shown in FIG. 3A:

$$x_4=ax_3-by_3+c$$

$$y_4=bx_3-ay_3+d$$

These equations can be rearranged as shown for more ease in solving for a, b, c, and d:

$$x_2=x_1a-y_1b+c$$

$$y_2=y_1a+x_1b+d$$

$$x_4=x_3a-y_3b+c$$

$$y_4=y_3a+x_3b+d$$

By applying known matrix inversion calculation techniques (either manually or using commercially available matrix software), the following solutions for a, b, c and d are derived:

$$a=\frac{(x_2-x_4)(x_1-x_3)+(y_2-y_4)(y_1-y_3)}{(x_1-x_3)(x_1-x_3)+(y_1-y_3)(y_1-y_3)}$$

$$b=\frac{(y_2-y_4)(y_1-y_3)-(x_2-x_4)(x_1-x_3)}{(x_1-x_3)(x_1-x_3)+(y_1-y_3)(y_1-y_3)}$$

$$c=\frac{(x_2+x_4)-a(x_1+x_3)+b(y_1-y_3)}{2}$$

$$d=\frac{(y_2+y_4)-a(y_1+y_3)-b(x_1+x_3)}{2}$$

Thus the rotation angle θ and $(x_0, y_0)$ and are calculated, and can be used to adjust movable stage 157.

Lastly, the position of the workpiece 112 may be adjusted at step 550 based on the computed translation angle and translation distance, thereby aligning the workpiece in the laser drilling system alignment data. Prior to this step, the magnitudes of θ and $(x_0, y_0)$ are compared with the specified error figures at step 545. If all the absolute values of calculated movements are less than half of the respective designed error figures, method 500 ends. Otherwise, method 500 proceeds to step 550.

In step 550, the laser system operator manually or electronically adjusts the rotation and translation of movable stage 157 to compensate for the rotation angle θ and $(x_0, y_0)$ determined in step 540 above. It is to be understood that for subsequent workpieces, only steps 535 to 550 need to be perform.

In reality, the axis of rotation may not be accurately known. The impact of this situation is very minimal using the methodology described above. The rigid body transformation guarantees than the matrix calculation will result in the correct rotation angle θ regardless whether the chosen transformation origin matches the real rotation axis or not. Unfortunately, due to this mismatch, there may be a measurable error in displacement, $(x_0, y_0)$, following the first iteration of matrix inversion. However, subsequent iteration will gradually converge to the precise rotation angle and displacement. Therefore, it is envisioned that after the first iteration brings the workpiece to the approximately correct rotation, a second iteration may be performed. In other words, the process may return to step 535 for additional iterations of placement correction. The second iteration will calculate the approximately correct displacement $(x_0, y_0)$. In any case, more precisely the rotation origin is chosen for the matrix inversion, faster the correct coordinates will be converged to with a given error specification.

Figure 6:
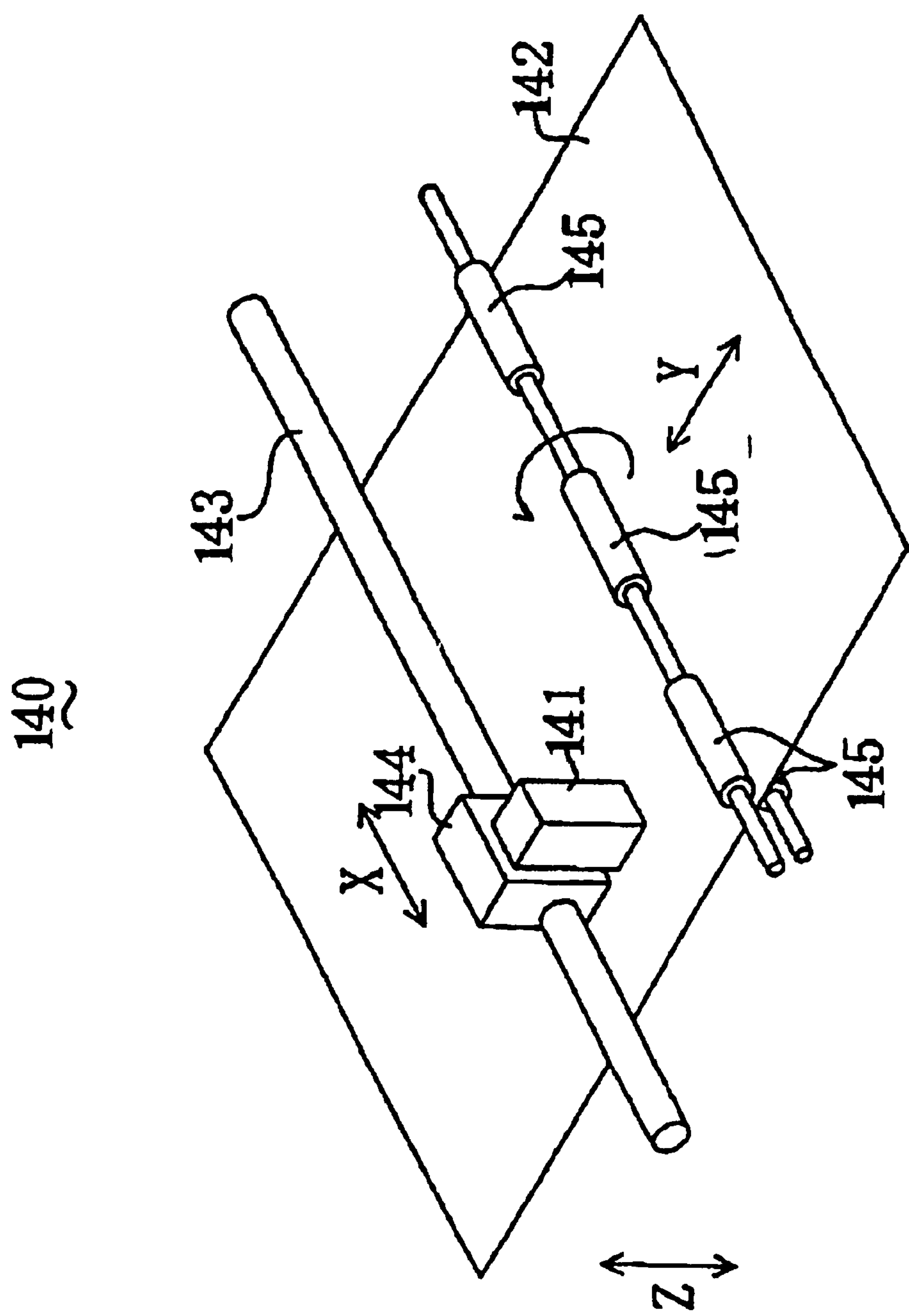
FIG. 6 is a perspective view illustrating the primary components of an ink-jet printer.

A laser drilling system in accordance with the present invention may be used to construct a nozzle plate of an ink-jet head as further described below. Referring to FIG. 6, an ink-jet printer 1140 includes an ink-jet head 1141 capable of recording on a recording medium 1142 via a pressure generator. The ink-jet head 1141 is mounted on a carriage 1144 capable of reciprocating movement along a carriage shaft 1143.

In operation, ink droplets emitted from the ink-jet head 1141 are deposited on the recording medium 1142, such as a sheet of copy paper. The ink-jet head 1141 is structured such that it can reciprocate in a primary scanning direction X in parallel with the carriage shaft 1143; whereas the recording medium 1142 is timely conveyed by rollers 1145 in a secondary scanning direction y.

Figure 7:
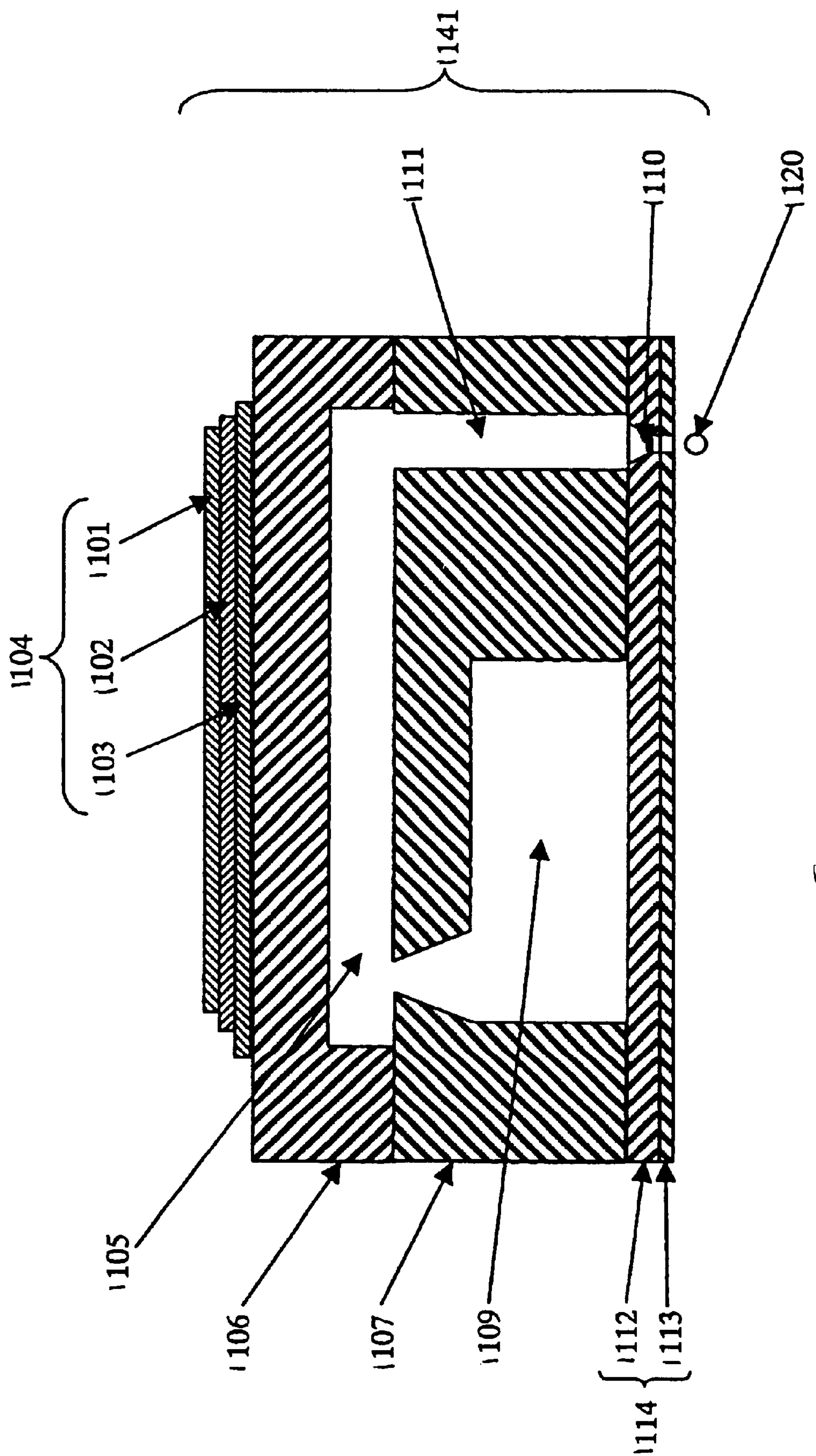
FIG. 7 is a cross-sectional schematic view of an exemplary ink-jet head.

FIG. 7 further illustrates the construction of an exemplary ink-jet head 1141. The ink-jet head is primarily comprised of a pressure generator 1104 and a nozzle plate 1114. In this embodiment, the pressure generator 1104 is a piezoelectric system having an upper electrode 1101, a piezoelectric element 1102, and a lower electrode 1103. Although a piezoelectric system is presently preferred, it is envisioned that other types of systems (e.g., a thermal-based system) may also be employed by the ink-jet head 1141.

The nozzle plate 1114 is further comprised of a nozzle substrate 1112 and a water repellent layer 1113. The nozzle substrate 1112 may be constructed from a metal or resin material; whereas the water repellant layer 1113 is made of fluororesin or silicone resin material. In this exemplary embodiment, the nozzle substrate 1112 is made of stainless steel having a thickness of 50 um and the water repellent layer 1113 is made of a fluororesin having a thickness of 0.1 um.

The ink-jet head 1141 further includes an ink supplying passage 1109, a pressure chamber 1105, and an ink passage 1111 disposed between the pressure generator 1104 and the nozzle plate 1114. In operation, ink droplets 1120 are ejected from the nozzle 1110. The nozzle 1110 is preferably formed without flash and foreign matter (e.g., carbon, etc.) in the nozzle plate. In addition, the accuracy of the nozzle outlet diameter is 20 um±1.5 um.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for aligning a workpiece in a laser drilling system, comprising:

determining position data for two or more target alignment markers residing on a movable workpiece holder, the target alignment markers being defined in relation a drilling pattern for the workpiece and indicative of a target workpiece position;

placing a workpiece on the movable workpiece holder, the workpiece having two or more alignment markers;

measuring position data for the alignment markers associated with the workpiece, thereby determining an actual workpiece position; and computing a translation angle between the actual workpiece position and the target workpiece position simultaneously with computing a translation distance between the actual workpiece position and the target workpiece position.

2. The method of claim 1 further comprises adjusting the workpiece based on the computed translation angle and translation distance, thereby aligning the workpiece in the laser drilling system.

3. The method of claim 1 further comprises defining a drilling pattern for the workpiece, such that the drilling pattern includes a first drill point and a spatially separate second drill point;

defining the position data for the target alignment markers in relation to the first and second drill points of the drilling pattern; and defining the position data for the alignment markers associated with the workpiece in relation to the first and second drill points of the drilling pattern.

4. The method of claim 3 wherein the step of computing a translation angle simultaneously with computing a translation distance further comprises defining a transformation relationship as follows:

$$\begin{bmatrix} x_2 \\ y_2 \\ x_4 \\ y_4 \end{bmatrix} = \begin{bmatrix} \cos\theta & -\sin\theta & 0 & 0 \\ \sin\theta & \cos\theta & 0 & 0 \\ 0 & 0 & \cos\theta & -\sin\theta \\ 0 & 0 & \sin\theta & \cos\theta \end{bmatrix} \begin{bmatrix} x_1 \\ y_1 \\ x_3 \\ y_3 \end{bmatrix} + \begin{bmatrix} x_0 \\ y_0 \\ x_0 \\ y_0 \end{bmatrix}$$

where θ is the translation angle, $(x_0, y_0)$ is the translation distance, $(x_1, y_1)$ is positional data for a first alignment marker, $(x_2, y_2)$ is the target position of the first alignment marker, $(x_3, y_3)$ is positional data for a second alignment marker, and $(x_4, y_4)$ is the target position of the second alignment marker.

5. The method of claim 4 wherein the step of computing a translation angle simultaneously with computing a translation distance further comprises solving the transformation relationship using a matrix calculation.

6. The method of claim 1 wherein the workpiece is further defined as a nozzle plate of an ink-jet head.

* * * * *

UNITED STATES PATENT AND TRADEMARK OFFICE

CERTIFICATE OF CORRECTION

PATENT NO. : 6,610,961 B1
DATED : August 26, 2003
INVENTOR(S) : Cheng

It is certified that error appears in the above-identified patent and that said Letters Patent is hereby corrected as shown below:

Title page,
Item [57], ABSTRACT,
Line 5, after "relation" insert -- to --.

Column 8,
Line 44, after "relation" insert -- to --.

Signed and Sealed this

Thirteenth Day of April, 2004

JON W. DUDAS
*Acting Director of the United States Patent and Trademark Office*